US007166836B1

(12) United States Patent
Russ, IV et al.

(10) Patent No.: US 7,166,836 B1
(45) Date of Patent: Jan. 23, 2007

(54) ION BEAM FOCUSING DEVICE

(75) Inventors: Charles W. Russ, IV, Loveland, CO (US); Steven M. Fischer, Loveland, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 11/221,491

(22) Filed: Sep. 7, 2005

(51) Int. Cl.
*H01J 49/42* (2006.01)
*H01J 37/26* (2006.01)

(52) U.S. Cl. ...................... 250/281; 250/288; 250/283; 250/396 R; 250/397

(58) Field of Classification Search ..................... None
See application file for complete search history.

(56) References Cited

U.S. PATENT DOCUMENTS

| | | | | |
|---|---|---|---|---|
| 3,725,700 | A * | 4/1973 | Turner | 250/292 |
| 5,248,875 | A | 9/1993 | Douglas et al. | |
| 6,111,250 | A | 8/2000 | Thomson et al. | |
| 6,417,511 | B1 | 7/2002 | Russ, IV et al. | |
| 6,534,764 | B1 | 3/2003 | Verentchikov et al. | |
| 6,627,883 | B1 * | 9/2003 | Wang et al. | 250/292 |
| 6,670,606 | B1 | 12/2003 | Verentchikov et al. | |
| 6,674,071 | B1 | 1/2004 | Franzen et al. | |
| 6,759,651 | B1 | 7/2004 | Li | |
| 6,797,947 | B1 | 9/2004 | Russ, IV et al. | |
| 6,833,543 | B1 | 12/2004 | Krutchinsky et al. | |
| 6,833,544 | B1 | 12/2004 | Campbell et al. | |
| 6,838,666 | B1 | 1/2005 | Ouyang et al. | |
| 6,849,848 | B1 | 2/2005 | Baranov et al. | |
| 2001/0050335 | A1 | 12/2001 | Whitehouse et al. | |
| 2002/0121594 | A1 | 9/2002 | Wang et al. | |
| 2003/0034451 | A1 | 2/2003 | Whitehouse et al. | |
| 2003/0141447 | A1 | 7/2003 | Verentchikov et al. | |
| 2005/0006580 | A1 | 1/2005 | Hager | |

* cited by examiner

*Primary Examiner*—Nikita Wells

(57) ABSTRACT

The invention provides an apparatus for focusing ions exiting a multipole mass filter. In general terms, the ion focusing apparatus comprises: a housing having an ion entrance and an ion exit, and, contained within the housing: a) a multipole ion guide having an open ion entrance end, and b) a neutral gas. The ion focusing apparatus is configured so that an ion beam enters the housing via the ion entrance and is collisionally focused by the multipole ion guide and neutral gas prior to exiting the housing. The apparatus is readily employed to collisionally focus an ion beam exiting a quadrupole mass filter. Also provided is a mass spectrometry system containing the ion focusing apparatus, and methods employing the same.

18 Claims, 4 Drawing Sheets

ION BEAM FOCUSING DEVICE

BACKGROUND

Mass spectrometry is an analytical methodology used for qualitative and quantitative analysis of compounds in a chemical or biological sample. Analytes in a sample are ionized, separated according to their mass by a spectrometer and detected to produce a mass spectrum. The mass spectrum provides information about the masses and in some cases the quantities of the various analytes that make up the sample. In particular embodiments, mass spectrometry can be used to determine the molecular weight or the molecular structure of an analyte in a sample. Because mass spectrometry is fast, specific and sensitive, mass spectrometer devices have been widely used for the rapid identification and characterization of biological analytes.

Mass spectrometers may be configured in many different ways, but are generally distinguishable by the ionization methods employed and the ion separation methods employed. For example, in certain devices parent analyte ions are isolated, the parent ions are fragmented to produce daughter ions and the daughter ions are subjected to mass analysis. The identity and/or structure of the parent analyte ion can be deduced from the masses of the daughter ions. Such devices, generally referred to as tandem mass spectrometers (or MS/MS devices) may be coupled with a liquid chromatography system (e.g., an HPLC system or the like) and a suitable ion source (e.g. an electrospray ion source) to investigate analytes in a liquid sample.

In certain mass spectrometers, e.g., so-called single quadrupole ("single quad"), triple quadrupole ("triple quad"), Q-TOF and Qq-TOF mass spectrometers, a quadrupole mass filter is employed. For example, in a single quadrupole mass spectrometer, an ion stream passes through the ion passageway of a quadrupole mass filter, and ions of a particular m/z (mass to charge ratio) are selected. The selected ions are detected by a detector that is present at the ion exit end of the ion passageway. In a triple quadrupole mass spectrometer, an ion stream passes through the ion passageway of a first quadrupole mass filter, and ions of a particular m/z ratio (mass to charge ratio) are selected. The selected ions are then fragmented in a collision cell to produce daughter ions, and those daughter ions are passed through a second quadrupole mass filter where daughter ions of a particular m/z ratio are selected. The selected daughter ions are detected by a detector that is present at the ion exit of the second mass filter. Because single and triple quadrupole mass spectrometers are relatively inexpensive and very robust, they are widely employed for sample analysis.

However, despite their popularity, mass spectrometers that employ a quadrupole mass filter are limited in their sensitivity because a significant number of ions are lost from the spectrometer between certain stages of the spectrometer (e.g., between a quadrupole mass filter and a collision cell or between a quadrupole mass filter and the detector). This is because ions typically have a significant amount of radial energy when they exit a quadrupole mass filter, and their flight trajectory is not towards to the next stage. This problem is exacerbated as the mass of ions gets larger, and critical when analyzing low abundance ions having a mass of greater than about 0.5 kDa.

There is therefore a need for new mass spectrometers in which ions are efficiently transferred out of a quadrupole mass filter into the next stage. This invention meets this need, and others.

SUMMARY OF THE INVENTION

The invention provides an apparatus for focusing ions exiting a multipole mass filter. In general terms, the ion focusing apparatus comprises: a housing having an ion entrance and an ion exit, and, contained within the housing: a) a multipole ion guide having an open ion entrance end, and b) a neutral gas. The ion focusing apparatus is configured so that an ion beam enters the housing via the ion entrance and is collisionally focused by the multipole ion guide and neutral gas prior to exiting the housing. The apparatus is readily employed to collisionally focus an ion beam exiting a quadrupole mass filter. Also provided is a mass spectrometry system containing the ion focusing apparatus, and methods employing the same. The invention finds use in a variety of analytical methods. For example, the invention finds use in chemical, environmental, forensic, food, pharmaceutical and biological research applications.

DEFINITIONS

The term "multipole ion guide" is used herein to encompass quadrupole, hexapole, octopole, and decapole ion guides (or similar devices containing other numbers of rods).

The term "rod" is used herein to describe an elongated electrode employed in a multipole ion guide. A rod may have any cross-sectional shape.

A "plurality" is at least 2, e.g., 2, 3, 4, 6, 8, 10, 12 or greater than 12. The phrases "a plurality of" and "multiple" are used interchangeably.

The term "adjacent" means next to or adjoining.

The term "immediately adjacent' is used herein to indicate that two compositions, e.g., two devices, are next to each other without any additional devices disposed therebetween.

Reference to a singular item includes the possibility that there are plural of the same. More specifically, as used herein and in the appended claims, the singular forms "a," "an," "said" and "the" include plural referents unless the context clearly dictates otherwise. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation.

Definitions may occur throughout the Detailed Description of the Invention.

DETAILED DESCRIPTION OF THE INVENTION

The invention provides an apparatus for focusing ions exiting a multipole mass filter. In general terms, the ion focusing apparatus comprises: a housing having an ion entrance and an ion exit, and, contained within the housing: a) a multipole ion guide having an open ion entrance end, and b) a neutral gas. The ion focusing apparatus is configured so that an ion beam enters the housing via the ion entrance and is collisionally focused by the multipole ion guide and neutral gas prior to exiting the housing. The apparatus is readily employed to collisionally focus an ion beam exiting a quadrupole mass filter. Also provided is a mass spectrometry system containing the ion focusing apparatus, and methods employing the same. The invention finds use in a variety of analytical methods. For example, the invention finds use in chemical, environmental, forensic, food, pharmaceutical and biological research applications.

Methods recited herein may be carried out in any logically possible order, as well as the recited order of events. Furthermore, where a range of values is provided, it is understood that every intervening value, between the upper and lower limit of that range and any other stated or intervening value in that stated range is encompassed within the invention.

The referenced items are provided solely for their disclosure prior to the filing date of the present application. Nothing herein is to be construed as an admission that the present invention is not entitled to antedate such material by virtue of prior invention.

Figure 1:
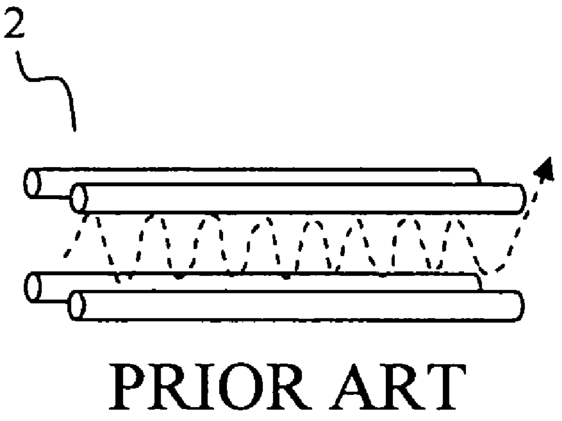
FIG. 1 is a schematic representation of a prior art quadrupole mass filter.

As noted in the background section above and as shown in FIG. 1, prior art mass spectrometer systems that employ a quadrupole mass filter 2 generally lose ions when transferring ions from the exit of the quadrupole mass filter to the next device of the system (e.g., a collision cell or an ion detector, for example). As illustrated by the dotted line in FIG. 1, ions exiting a quadrupole mass filter generally have a significant amount of radial energy, and, as such, often exit the mass filter in an undesirable trajectory. Such ions are often lost from the system, leading to a decrease in system sensitivity.

The invention provides a means for reducing the effect of radial energy of ions exiting a multipole, e.g., quadrupole, mass filter, thus allowing efficient entry of those ions into the next device of a mass spectrometer system. The invention may be employed in any mass spectrometer system that contains a multipole mass filter, and, as such, finds widespread use.

Figure 2:
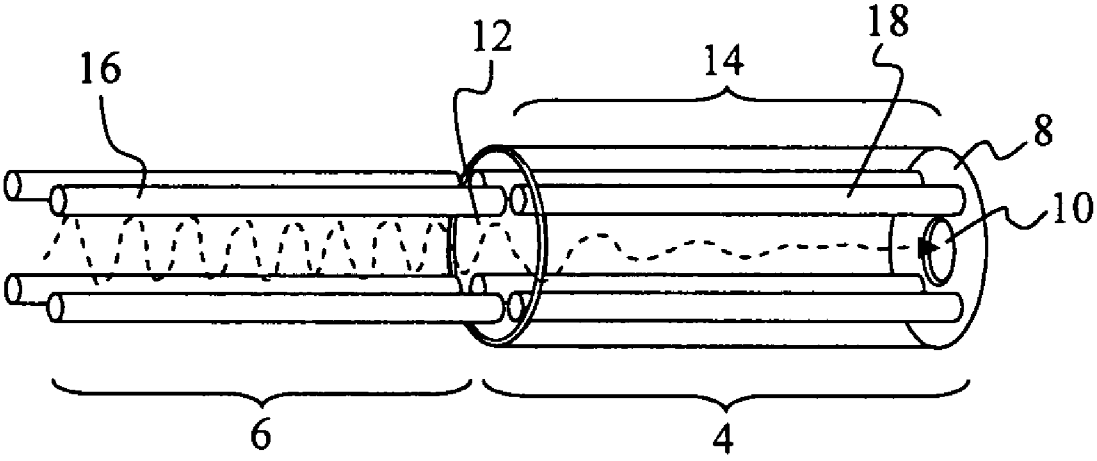
FIG. 2 is a schematic representation of a first exemplary embodiment of the invention.

Many of the general features of one embodiment of the invention are illustrated in FIG. 2. FIG. 2 schematically illustrates an ion focusing apparatus of the invention 4, adjacent to a quadrupole mass filter 6. Quadrupole mass filters are well known components of certain mass spectrometer systems and need not be described in any great detail herein. Descriptions of exemplary quadrupole mass filters that may be employed herein are found in U.S. Pat. Nos. 2,939,952, 3,129,327, 6,720,554, 4,985,626 and 4,816,675, which US patents are incorporated herein by reference in their entirety. In general terms, the ion focusing apparatus of the invention 4 contains a housing 8 having an ion entrance 12 and an ion exit 10, and, contained within the housing, a multipole ion guide 14. During operation, the housing also contains a neutral gas and, as will be described in greater detail below, the gas may be supplied via the ion exit of the housing (shown in FIG. 4B) or via a dedicated gas inlet elsewhere on the housing (shown in FIG. 4B), for example. Although not absolutely required for operation of the device, and as shown in FIG. 2, the ion entrance is generally larger than the radial dimension of the multipole ion guide so that the ion entrance end of the multipole ion guide (including the ends of the rods) is exposed through the ion entrance of the housing.

The multipole device 14 of the ion focusing apparatus is generally operated in radio frequency-only "RF-only" mode and thereby transmits ions having a broad range of masses, as opposed to the quadrupole mass filter, which operates with DC and RF voltages in order to selectively filter ions of a particular molecular weight.

As shown in FIG. 2, the ion focusing apparatus of the invention is typically employed immediately adjacent to a quadrupole mass filter 6 (i.e., disposed next to a quadrupole mass filter without any other electric field-producing devices, e.g., electrical lenses or ion focusing devices, physically disposed therebetween). The ends of the rods 16 at the ion exit end of the quadrupole mass filter are, in certain embodiments, as close as possible to the ends of the rods 18 at the ion entrance end of the multipole ion device in order to minimize fringing field effects and provide continuity of the confining RF electric field, thereby preventing ions from escaping from the space between the quadrupole mass filter and the multipole ion guide. As will be described in greater detail below, a neutral gas is introduced into the interior of housing 8, and acts to reduce the radial energy of the ions passing through the ion focusing apparatus by collisional cooling. Ions exiting the ion focusing apparatus have less radial energy than ions entering the apparatus, and, as such, generally exit the ion focusing apparatus with a trajectory that is towards the next device of the system (e.g., towards a detector or entrance orifice of a collision cell, for example).

As illustrated by a dotted line in FIG. 2, ions passing through and exiting quadrupole mass filter 16 have a significant amount of radial energy. The ions exit the quadrupole mass filter 16, immediately enter the ion entrance 12 of the ion focusing apparatus of the invention, and are collisionally cooled by the inert gas disposed therein. Ions exit the ion focusing apparatus with less radial energy in a beam of smaller diameter than when they entered the apparatus, thereby increasing the probability that they will be useable by the next device, rather than in a direction that causes their loss. In other words, the ion focusing apparatus of the invention decreases radial energy of ions passing therethrough as well as decreases the diameter of the beam of ions traveling therethrough to provide a beam of ions that is more focused than when it entered the device. The axial ion energy employed during operation of an ion focusing apparatus of the invention is insufficient to cause fragmentation of analytes passing through the ion passageway of the device. The amount of gas may be regulatable to provide desirable ion cooling and ion beam focusing effects.

Figure 3A:
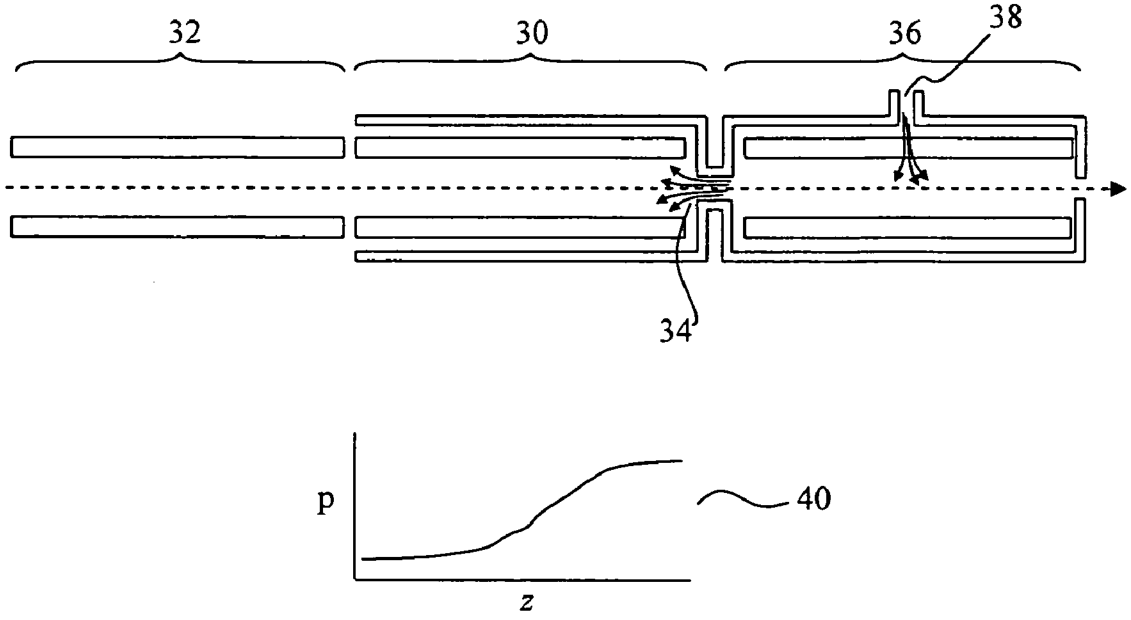
FIG. 3A is a schematic representation of a second exemplary embodiment of the invention.

As noted above and as illustrated in FIGS. 3A and 3B, neutral gas may be introduced into the subject ion focusing apparatus by a number of means. FIG. 3A shows a device in which neutral gas is supplied to a subject ion focusing apparatus 30 (shown immediately adjacent to a quadrupole mass filter 32) via its ion exit 34. In this embodiment, the ion focusing apparatus may be immediately upstream from and linked to a collision cell 36, e.g., a cell for fragmenting ions by collisional dissociation. Collision cells for fragmenting ions are commonly used in a variety of mass spectrometer systems, including triple quadrupole and Q-TOF systems. In the embodiment shown in FIG. 3A and as shown by the clusters of arrows, gas is introduced into collision cell 36 (typically via an ion inlet 38), and drawn into the ion focusing apparatus 30 via its ion exit. Since collision chamber 38 is at a higher gas pressure than the ion focusing apparatus 30, the gas will move into the ion focusing apparatus without the need for any pump disposed between the two devices. The graph 40 shown in FIG. 3A illustrates gas pressure p along the length z of the ion focusing apparatus of this embodiment. In this embodiment, the gas forms a pressure gradient that is greatest at the ion exit end of the apparatus, and least at the ion entrance.

Figure 3B:
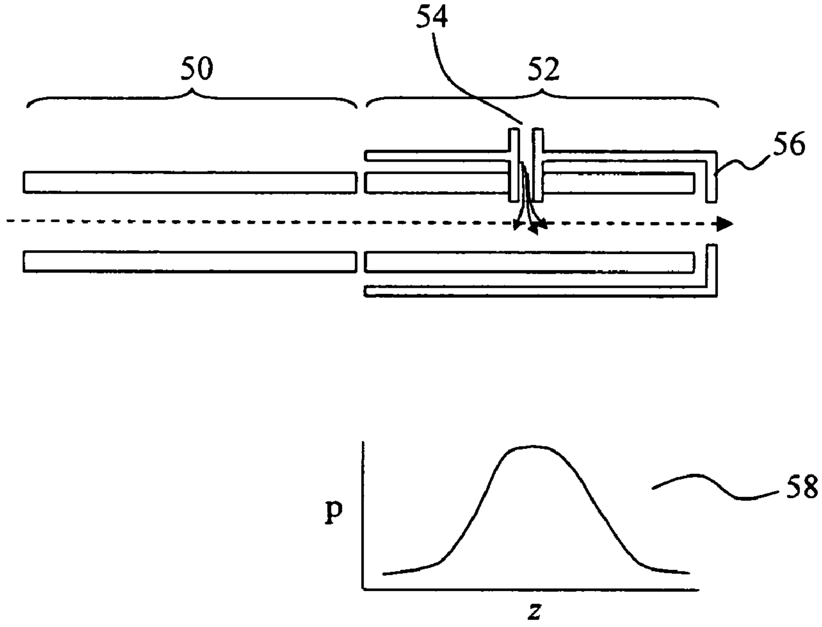
FIG. 3B is a schematic representation of a third exemplary embodiment of the invention.

FIG. 3B shows a device in which gas is supplied to ion focusing apparatus 52 (shown immediately adjacent to a quadrupole mass filter 50) via a gas inlet 54 on the housing 56 of the apparatus. In the embodiment shown in FIG. 3B and as shown by the clusters of arrows, gas is introduced into the ion focusing apparatus 52 via a gas inlet 54, and exits the apparatus via both the ion entrance and ion exit of the apparatus. The graph 58 shown in FIG. 3B illustrates gas pressure p along the length z of the ion focusing apparatus of this embodiment. In this embodiment, the gas forms a pressure gradient that is greatest beneath the gas inlet, and least at the ion entrance and exit of the apparatus. The gas outlet orifice of the gas inlet may be flush with the interior of housing 56, or, in certain embodiments (and as shown in FIG. 3B) the gas inlet may extend into the chamber formed by housing 56. In certain embodiments, the gas inlet may terminate within the ion passageway of the multipole ion guide disposed within the housing.

Figure 4A:
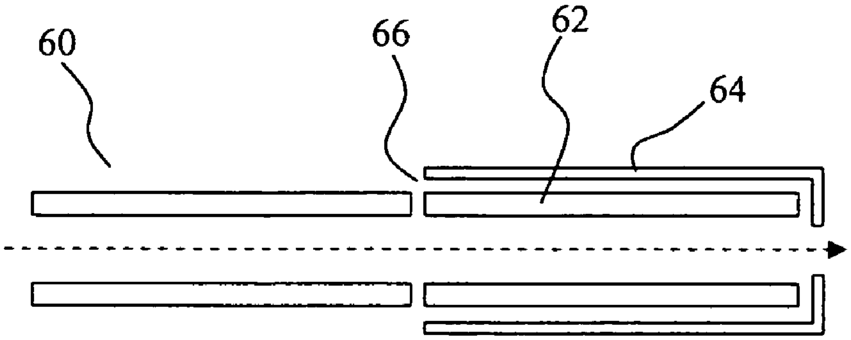
FIG. 4A is a schematic representation of a fourth exemplary embodiment of the invention.
Figure 4B:
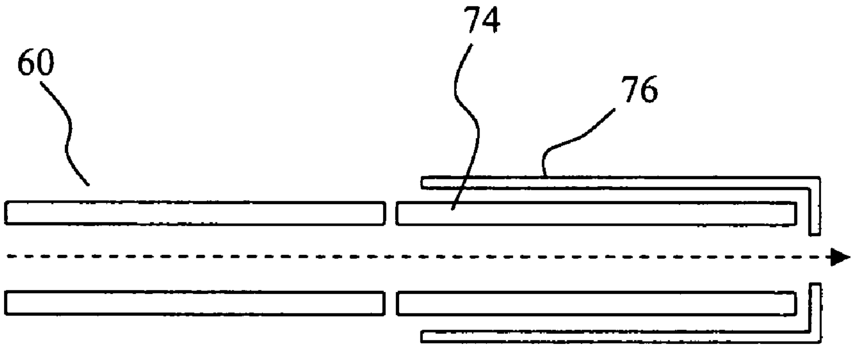
FIG. 4B is a schematic representation of a fifth exemplary embodiment of the invention.
Figure 4C:
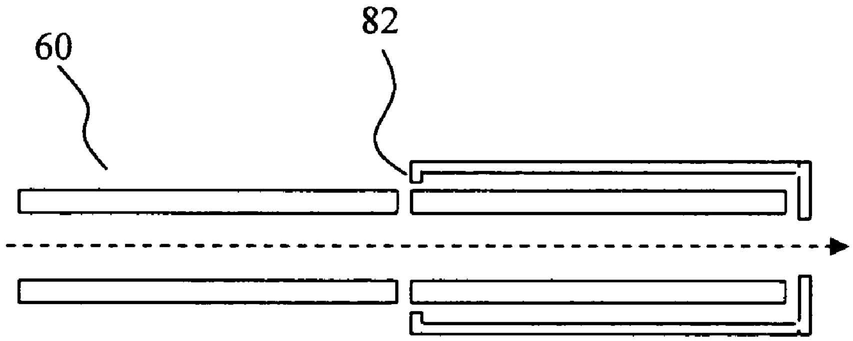
FIG. 4C is a schematic representation of a sixth exemplary embodiment of the invention.

FIGS. 4A–4C illustrate a variety of configurations of an apparatus of the invention. In each of FIGS. 4A–4C, a quadrupole mass filter is illustrated on the left as element 60, and an ion focusing apparatus of the invention is illustrated on the right. As illustrated in FIG. 4A, the rods 62 of the ion focusing apparatus may be substantially flush with the housing 64 at the ion entrance 66. As illustrated in FIG. 4B, the rods 74 of the ion focusing apparatus may protrude out of the housing 76 at the ion entrance. As illustrated in FIG. 4C, the housing at the ion entrance of the apparatus may have a flange or lip 82 which may, in certain embodiment, provide structural strength to the housing. In representative embodiments, any flange or lip present does not cover the ends of the rods. Each of FIGS. 4A–4C shows a subject ion focusing apparatus in which one end of the multipole device is exposed though the ion entrance of the housing of the apparatus. The ends of the rods of an instant apparatus may be exposed through the ion entrance of the apparatus if they protrude through the ion entrance, are substantially flush with the ion entrance, or are recessed within the ion entrance, as long as they not covered by the ion entrance and are viewable from the ion entrance end of the apparatus.

The multipole ion guide employed in an ion focusing apparatus of the invention contains a plurality of rods (i.e., 2 or more rods, typically an even number of rods, e.g., 4, 6, 8 or 10 or more), longitudinally arranged around a central axis along which ions are directionally moved (i.e., from one end of the central axis to the other end of the central axis) during operation of the apparatus. A suitable arrangement of rods in an exemplary quadrupole ion guide is shown in FIG. 2. In general the rods of a multipole ion guide are conductive, and are arranged to provide an input end for accepting ions, an output end for exiting ions, and a central axis extending from the input end to the output end. In certain embodiments, the rods may be held in a suitable arrangement by one or more collars, although several alternatives to collars may be used. In many embodiments, the longitudinal axes of the rods are parallel and equally distanced from the central axis, although, in certain cases the rods of a multipole ion guide may be non-parallel and non-equally spaced. The spacing between consecutive rods is usually the same between all rods of a ion guide, although rod spacing may vary between different devices. In use as an ion guide, the rods are electrically connected so as to provide a radio frequency (RF) field that confines the ions to a region proximal to the central axis, and, optionally, a direct current (DC) electric potential difference along the central axis for moving ions along the central axis. If an end-to-end DC gradient is employed, the DC difference may be in the range of about 0.3 to about 50 volts (e.g., about 0.8 to about 15 volts or about 10 volts), although differences well outside of this range are easily envisioned. In general, the ion-confining RF field produced by the rods of the ion guide typically has a frequency of 0.1 MHz to 10 MHz, e.g., 0.5 MHz to 5 MHz. In scanning mode, the ion-confining RF field may have a magnitude of greater than 0V to 50,000V peak-to-peak, e.g., greater than 0V to 4,000V peak to peak. When the ion guide is not operated in scanning mode, the ion-confining RF field may, in certain embodiments, have a magnitude of 20 V to 10,000V peak-to-peak, e.g., 400V to 800V peak to peak, for example. Again, a wide variety of RF frequencies and magnitudes may be employed.

The multipole ion guide may have dimensions similar to that of other multipole ion guides, and, as such, may vary greatly in size. In certain embodiments, the multipole ion guide has an overall length of 4 cm to 40 cm, and has rods that define an inner passage having an inscribed diameter of 2 mm to 30 mm. Devices having dimensions outside of these ranges are readily employed in certain systems, however. Depending on the materials used for fabrication and the dimensions desired, in certain embodiments a rod may be from 5 cm to 50 cm in length (e.g., 10–30 cm) and may have a diameter of 0.7 mm to 15 mm (e.g., 1 mm to 8 mm), although rods having dimensions outside of these ranges may be readily employed in certain systems. Rods having any cross-sectional shape, e.g., a cross sectional shape that is circular, oval, semi-circular, concave, flat, square, rectangular, substantially hyperbolic, or multisided, may be employed. In certain embodiments, the cross-sectional shape or dimensions of the rod may change down the length of the rod. In general, the opposing rods of a multipole ion guide employed herein are matched (i.e., have the same shape and dimensions).

The housing surrounding the multipole ion guide is generally dimensioned so that the multiple ion guide can be placed within the housing, with the ends of rods of the multipole ion guide protruding out of or substantially flush with the ion entrance of the housing. In order to maximize gas pressure within the housing, the housing may be dimensioned to have the least practical void space possible around the ion guide employed in the apparatus. In one embodiment, and illustrated in FIG. 2, the housing is generally cylindrically shaped, and may have a wall with an ion exit orifice at the ion exit end of the housing. The housing may be made of any convenient material, such as a metal, and is generally electrically insulated from the multipole ion guide. The overall size and shape of a subject apparatus, as well as the components therein, are generally sufficient to generate a desired focusing effect on ions passing therethrough. In general, at least a substantial portion, e.g., at least about 50%, at least about 70%, at least about 90%, at least about 95%, or 100% of the length of the ion guide is contained within the housing.

As illustrated in FIG. 2, the multipole ion guide extends from the ion entrance of the housing to the ion exit of the housing As noted above and as shown in FIG. 2, in use, the ion focusing apparatus is generally positioned immediately adjacent to a quadrupole mass filter. The distance between the rods of the ion focusing device and the quadrupole mass filter are generally as close as possible without touching so as to minimize field effects (e.g., fringe field effects) and ion loss. The rods of the adjacent devices are positioned at a distance that is sufficient to prevent arcing during operation. In certain embodiments, the ends of the rods at the ion entrance end of the ion focusing apparatus of the invention may be less than about 2 cm (e.g., less than about 1 cm, less than about 0.5 cm, less than about 0.2 cm or less than about 0.1 cm) from ends of the rods at the ion exit end of the quadrupole mass filter.

In particular embodiments, the ion guide of the ion focusing apparatus and the quadrupole mass filter may be physically and electrically "matched". The ion guide of the ion focusing apparatus and the quadrupole mass filter may be physically matched in that the ion guide of the ion focusing apparatus is a quadrupole ion guide (and therefore contains the same number of poles as the quadrupole mass filter), and in that the cross-sectional shape and size of the rods at the ion entrance of the ion guide is substantially the same as that of the rods at the ion exit of the mass filter. Further, and as illustrated in FIG. 2, the longitudinal axes of adjacent rods of the ion guide and mass filter are aligned so that the rods are positioned in tandem. The ion guide of the ion focusing apparatus and the quadrupole mass filter may be electrically matched in that the RF voltages applied to the rods of the quadrupole ion guide are substantially identical, in terms of frequency, magnitude and phase, to the rods of the adjacent quadrupole mass filter. In certain embodiments, the RF voltages applied to the quadrupole ion guide and the adjacent quadrupole mass filter may be phase locked and/or phase coherent, in relation to each other. In this embodiment, each rod of the multipole ion guide may be physically joined to an adjacent rod of the mass filter by a capacitor so that the RF field (but not the mass-selecting DC field) may be propagated to the multipole ion guide to from the quadrupole mass filter. In other words, if two multipole devices are matched, the devices a) are arranged in tandem (as shown in FIG. 2) with no intervening devices or elements that interfere with the RF fields produced by the rods of the two devices; b) contain the same number of rods (e.g., 4), and c) have an RF field that is matched, i.e., substantially the same (i.e., i. the magnitude of the RF voltage of the multipole device is +/−0.5× the RF voltage magnitude of the quadrupole mass filter, e.g., less than 10%, less than 5% or less than 1% of the RF of the quadrupole mass filter; ii. the phase of the RF voltage of the multipole device is within (i.e., + or −) 15° of the phase of the quadrupole mass filter, e.g., less than 10°, less than 5° or less than 1° of the phase of the quadrupole mass filter; and iii. the frequency of the RF voltage of the multipole device is within (i.e., + or −) 5% of the frequency of the quadrupole mass filter, e.g., less than 2% or less than 1% of the frequency of the quadrupole mass filter. If the RF voltage of the rods of the two devices are phase coherent, the phase is generally the same. However, if the RF frequency of the rods of the two devices are not phase coherent, then the RF frequency may be different. A DC voltage differential, if present between the quadrupole mass filter and the ion guide of the ion focusing device, is generally insufficient to cause ion fragmentation. Accordingly, the quadrupole mass filter and the ion guide of the ion focusing device may, in certain embodiments, have a DC voltage differential that is less than about 5V. For large singly charged ions this could be as high as 20V, although it is also possible that the voltage could be changed with the mass setting of the quadrupole mass filter.

The neutral gas introduced into the housing of the ion focusing device, either directly (i.e., via a gas inlet on the housing) or indirectly (e.g., via an adjacent gas-containing collision cell, for example) is generally supplied from a source of neutral gas, e.g., a gas tank containing the neutral gas. In particular embodiments, the neutral gas employed is pure argon, nitrogen or helium, although other neutral gasses may be employed. The amount of neutral gas introduced into the housing may be regulatable, via a gas restrictor for example, in order to provide a desired level of focusing. In certain embodiments, an apparatus of a particular length may be chosen to provide a desired focusing effect. The optimum dimensions of an apparatus, the voltages employed, and the amount of gas used may be empirically determined or calculated for each apparatus employed, and, in certain embodiments, for each mass of ion.

The ion focusing apparatus is generally configured to provide at least 5 collisions per ion (e.g., at least 10 collisions per ion, at least 20 collisions per ion) as the ion passes through the ion focusing apparatus. In particular embodiments in which an accelerating DC gradient is employed, the ion focusing apparatus is generally configured to provide at least about 10 to about 30 collisions per ion as it passes through the apparatus.

Mass Spectrometry Systems

Figure 5A:
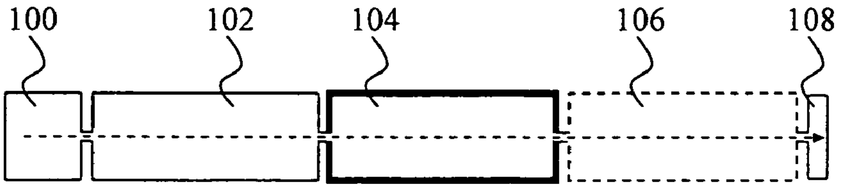
FIGS. 5A–5D are schematic representations of exemplary mass spectrometry systems of the invention.

The ion focusing apparatus is readily employed in conjunction with an adjacent quadrupole mass filter in a variety of mass spectrometry systems that generally contain an ion source, a quadrupole mass filter, a subject ion focusing apparatus and a detector. FIG. 5A schematically illustrates an exemplary mass spectrometer system that employs an ion focusing apparatus described above. The system contains an ion source 100, a quadrupole mass filter 102 downstream from the ion source, a subject ion focusing apparatus 104 adjacent to quadrupole mass filter 102 and a detector 108. As shown by element 106, the system may optionally include further mass separation devices (e.g., other mass filters, ion traps, time of flight mass spectrometers, etc.) between the subject ion focusing apparatus 104 and detector 108. As would be recognized by one of skill in the art, the system may include other elements, e.g., skimmers, ion guides, pumps, power supplies, lenses, conduits, and electrodes that are conventional in the mass spectrometry arts.

In general, the system is configured for: a) producing ions an ion source, b) filtering the ions in a quadrupole mass filter to produce a filtered ion beam; c) focusing the filtered ion beam to produce a focused ion beam using a ion focusing apparatus immediately adjacent to said quadrupole mass filter; and d) detecting ions in the focused ion beam.

The ion source employed in a subject system may be any type of ion source, including, but not limited to a matrix assisted laser desorption ionization source (MALDI) operated in vacuum or at atmospheric pressure (AP-MALDI), an electrospray ionization (ESI) source, a chemical ionization source (CI) operated in vacuum or at atmospheric pressure (APCI), an electron impact (EI) or an inductively coupled plasma (ICP) source, among others. The chemical samples introduced to the ion source may be subjected to a pre-separation with a separation device, such a liquid chromatograph (LC) or a gas chromatograph (GC).

In certain embodiments, an ion source of a mass spectrometer system may be connected to an apparatus for providing a sample containing analytes to the ion source. In certain embodiments, the apparatus is an analytical separation device such as a gas chromatograph (GC) or a liquid chromatograph (LC), including a high performance liquid chromatograph (HPLC), a micro- or nano-liquid chromatograph or an ultra high pressure liquid chromatograph (UHPLC) device, a capillary electrophoresis (CE), or a capillary electrophoresis chromatograph (CEC) apparatus, however, any manual or automated injection or dispensing pump system may be used. In particular embodiments, a sample may be provided by means of a nano- or micropump, for example.

Figure 5B:
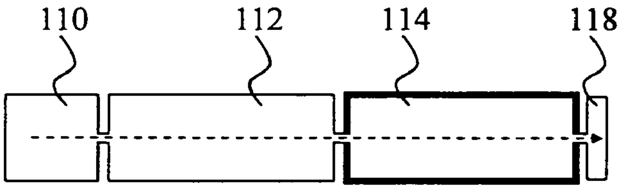
Figure 5C:
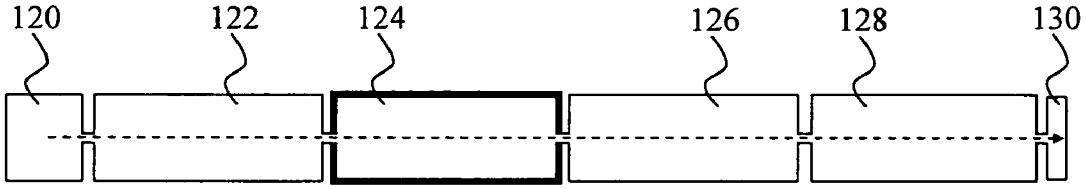
Figure 5D:
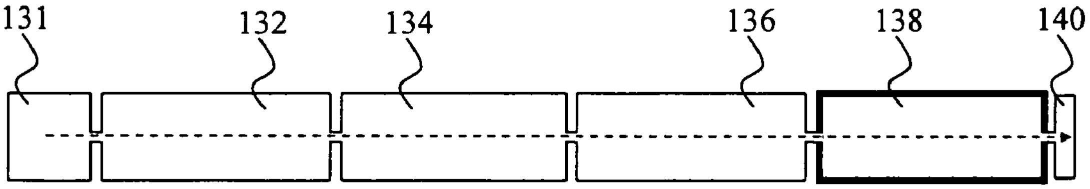

Particular mass spectrometer systems in which the subject apparatus may be employed are illustrated in FIGS. 5B–5D. In one embodiment illustrated in FIG. 5B, the mass spectrometer system is a so called "single quadrupole" or "sing quad" system in which ions are generated in an ion source 110, filtered using quadrupole mass filter 112, focused with a subject ion focusing apparatus 114, and detected by detector 118. In this embodiment, the ion focusing apparatus 114 helps direct ions exiting quadrupole mass filter 112 towards detector 108. In another embodiment illustrated in FIGS. 5C and 5D, the mass spectrometer system is a so-called "triple quadrupole" or "triple quad" system. Since such a system contains two quadrupole mass filters, the subject ion focusing apparatus may be disposed at one or both of two distinct positions within a system. In one embodiment and as illustrated in FIG. 5C, the system may contain: an ion source 120, a first quadrupole mass filter 122, a subject ion focusing device 124, a collision cell for fragmenting ions 126, a second quadrupole mass filter 128, and an ion detector 130. In this embodiment, the ion focusing apparatus 124 helps direct ions exiting quadrupole mass filter 122 towards detector the inlet orifice of collision cell 126. In another embodiment and as illustrated in FIG. 5D, the system may contain: an ion source 131, a first quadrupole mass filter 132, a collision cell for fragmenting ions 134, a second quadrupole mass filter 136, a subject ion focusing device 138, and an ion detector 140. In this embodiment, the ion focusing apparatus 138 helps direct ions exiting quadrupole mass filter 136 towards detector 140.

The invention finds general use in methods of sample mass analysis, where a sample may be any material (including solubilized or dissolved solids) or mixture of materials, typically, although not necessarily, dissolved in a solvent. Samples may contain one or more analytes of interest. Samples may be derived from a variety of sources such as from foodstuffs, environmental materials, a biological sample such as tissue or fluid isolated from a subject (e.g., a plant or animal subject), including but not limited to, for example, plasma, serum, spinal fluid, semen, lymph fluid, the external sections of the skin, respiratory, intestinal, and genitourinary tracts, tears, saliva, milk, blood cells, tumors, organs, and also samples of in vitro cell culture constituents (including but not limited to conditioned medium resulting from the growth of cells in cell culture medium, putatively virally infected cells, recombinant cells, and cell components), or any biochemical fraction thereof. Also included by the term "sample" are samples containing calibration standards or reference mass standards.

Components in a sample are termed "analytes" herein. In certain embodiments, the subject methods may be used to investigate a complex sample containing at least about 1, 5, 10, $10^2$, $10^4$, $10^6$, $10^8$, $10^{10}$, $10^{12}$ or more species of analyte. The term "analyte" is used herein to refer to a known or unknown component of a sample. In certain embodiments, analytes are biopolymers, e.g., polypeptides or proteins, that can be fragmented into smaller detectable molecules.

All publications and patents cited in this specification are herein incorporated by reference as if each individual publication or patent were specifically and individually indicated to be incorporated by reference. The citation of any publication is for its disclosure prior to the filing date and should not be construed as an admission that the present invention is not entitled to antedate such publication by virtue of prior invention.

While the present invention has been described with reference to the specific embodiments thereof, it should be understood by those skilled in the art that various changes may be made and equivalents may be substituted without departing from the true spirit and scope of the invention. In addition, many modifications may be made to adapt a particular situation, material, composition of matter, process, process step or steps, to the objective, spirit and scope of the present invention. All such modifications are intended to be within the scope of the claims appended hereto.

What is claimed is:

1. A device for collisional focusing of ions, comprising:

a) a multipole mass filter comprising at least four rods; and b) an ion focusing apparatus adjacent to said multipole mass filter, comprising:

a housing having an open ion entrance and an ion exit end and:

a multipole ion guide and a neutral gas, disposed within said housing, wherein said multipole mass filter and said multipole ion guide comprise a matching number of rods and a matching RF field.

2. The device of claim 1, wherein said RF field is matched in terms of phase, amplitude and frequency.

3. The device of claim 1, wherein said multipole mass filter is a quadrupole mass filter.

4. The device of claim 1, wherein said multipole ion guide comprises a plurality of rods that are arranged along a central axis to define an ion passageway having an ion entrance end and an ion exit end.

5. The device for manipulating ions of claim 1, wherein said ion entrance end of said multipole ion guide is flush with or protrudes through said ion entrance.

6. The device of claim 1, wherein said ion focusing apparatus is operably connected to a source of neutral gas.

7. The device of claim 1, wherein said neutral gas is supplied via a gas inlet on said housing.

8. The device of claim 1, wherein said ion exit is operably connected to a downstream collision cell and said neutral gas is supplied from said downstream collision cell.

9. The device of claim 1, wherein said neutral gas is argon, helium or nitrogen.

10. The device of claim 1, wherein said multipole ion guide is an RF-only multipole ion guide.

11. The device of claim 1, wherein said ion focusing apparatus comprises:

a housing comprising an ion entrance for receiving ions from said multipole mass filter and an ion exit;

a multipole ion guide extending from said ion entrance to said ion exit; and a neutral gas within said housing.

12. The device of claim 1, wherein said multipole ion guide produces a longitudinal DC voltage gradient to assist ion movement though said multipole ion guide.

13. The device of claim 1, wherein said device is configured so that an ion beam exits said multipole mass filter and is collisionally focused in said ion focusing apparatus by said neutral gas prior to exiting said housing.

14. A mass spectrometer system, comprising:

a) an ion source for producing ions, b) a multipole mass filter for filtering said ions; and c) an ion focusing apparatus adjacent to said multipole mass filter, comprising:

a housing having an open ion entrance and an ion exit end and:

a multipole ion guide and a neutral gas, disposed within said housing, wherein said multipole mass filter and said multipole ion guide comprise a matching number of rods and a matching RF field; and d) an ion detector for detecting said ions.

15. The mass spectrometer system of claim 14, wherein said RF field is matched in terms of phase, amplitude and frequency.

16. The mass spectrometer system of claim 14, wherein said multipole mass filter is a quadrupole mass filter.

17. The mass spectrometer system of claim 14, wherein said ion source is a vacuum or atmospheric pressure MALDI source, an electrospray ionization (ESI) source, a chemical ionization source (CI) operated in vacuum or at atmospheric pressure (APCI), an electron ionization ion source (EI) or an inductively coupled plasma (ICP) source, or any combination thereof.

18. The mass spectrometer system of claim 14, wherein said mass spectrometer system is a single quadrupole mass spectrometer system or a triple quadrupole mass spectrometer system.

* * * * *